United States Patent [19]
Shy

[11] Patent Number: 5,985,516
[45] Date of Patent: Nov. 16, 1999

[54] ELECTRON BEAM IMAGING METHOD USING CONDUCTING POLYANILINE MATERIAL

[75] Inventor: Shyi-Long Shy, Hsin-Chu, Taiwan

[73] Assignee: United Microelectronics Corp., Hsinchu, Taiwan

[21] Appl. No.: 08/916,196

[22] Filed: Aug. 21, 1997

Related U.S. Application Data

[60] Provisional application No. 60/051,747, Jul. 3, 1997.

[51] Int. Cl.[6] ............................................. G03C 5/00
[52] U.S. Cl. ............................................. 430/296; 430/311
[58] Field of Search ....................................... 430/296, 311

[56] References Cited

U.S. PATENT DOCUMENTS

| | | | |
|---|---|---|---|
| 5,137,799 | 8/1992 | Kaempf et al. | 430/270 |
| 5,198,153 | 3/1993 | Angelopoulos et al. | 252/500 |
| 5,200,112 | 4/1993 | Angelopoulos et al. | 252/500 |
| 5,202,061 | 4/1993 | Angelopoulos et al. | 252/500 |
| 5,403,680 | 4/1995 | Otagawa et al. | 429/213 |
| 5,409,801 | 4/1995 | Kasowski et al. | 430/296 |

OTHER PUBLICATIONS

F.Mizuno, et al."Application of a High–Throughput Electron–Beam System for 0.3 $\mu$m Large Scale Intergration," J.Vac. Sci. Technol. B 12(6), Nov./Dec. 1994, pp. 3440–3443.

*Primary Examiner*—Christopher G. Young
*Attorney, Agent, or Firm*—Rabin & Champagne, P.C.

[57] ABSTRACT

A method of preparing a surface for exposure to an electron beam includes forming a water soluble self-acid-doped conducting polyaniline material. The water soluble self-acid-doped conducting polyaniline material may be poly (aniline-co-N-propanesulfonic acid aniline). The polyaniline material may be mixed with polyvinyl alcohol and applied to a surface prior to subjecting the surface to an electron beam. The electron beam is then transmitted through the material and onto the surface, with the polyaniline material acting as a charge dissipation layer.

14 Claims, 3 Drawing Sheets

ELECTRON BEAM IMAGING METHOD USING CONDUCTING POLYANILINE MATERIAL

This application claims priority from provisional application Ser. No. 60/051,747, filed Jul. 3, 1997.

BACKGROUND OF THE INVENTION

1. Field of the Invention

The present invention relates to electron beam lithography and to the use of a charge dissipation layer as part of a mask forming process.

2. Description of the Related Art

Electron beam lithography may be used for producing device structures having dimensions in the sub-micron range due to the small wavelength (often less than 1 angstrom) of the electrons used. Unlike optical lithography, resolution in electron beam lithography is not presently limited by diffraction but is instead limited by electron scattering in the target materials and aberrations in the electron beam steering and shaping optics. Typical electron beam applications include mask fabrication and device fabrication by direct writing of patterns onto a resist-covered substrate. In microelectronic applications, a pattern on a substrate can be formed by first depositing a resist material on the substrate and then selectively exposing the resist material to an electron beam in a manner which locally alters a chemical or physical property of the resist. The resist material in the exposed region might, for example, either be made soluble or insoluble upon exposure to the electron beam radiation so that the solubility of the exposed region is different from that of the unexposed region. Either the exposed or the unexposed region can be removed using a solvent, depending on the particular process chosen, and the remaining resist used to protect the underlying material during processing steps such as etching or ion implantation.

One problem associated with electron beam lithography is charging of the resist by the electron beam. The resist material is typically a hardened polymer material that is highly insulating. When an electron beam is directed at the insulating surface of the resist, charge from the electron beam accumulates on the surface of the resist, creating an electric field which subsequently distorts the electron beam adjacent to the surface. Electron beams used for lithography may have a cross-section of less than 1 micron, and it is possible for even a small amount of charge to distort the electron beam to a considerably larger size or can deflect the beam by distances at least on the order of the beam diameter. The distortion results in a loss of precision and leads to pattern registration errors and poor overlay accuracy. To avoid charging the resist, a thin conducting metal layer of gold or palladium might be deposited on the resist prior to electron beam exposure. However, such a thin metal layer typically is more difficult to remove than the resist layer and additional processing steps must be added to the fabrication process when such a metal layer is used. In addition, the heat generated during the metal deposition process may degrade the lithographic properties of the resist.

U.S. Pat. No. 5,198,153 to Angelopoulos, et al., relates to a polymer material for use as a negative resist for electron beam lithography. The polymer includes a dopant species that can be rendered conductive by selective application of an energy source to the polymer. The polymer acts as a matrix into which a reagent containing the dopant species is added to form a solid solution. The dopant species is capable of disassociating upon exposure to an energy source. The dopant precursor is selected from the group consisting of onium salts, iodonium salts, borate salts, tosylate salts, triflate salts and sulfonyloxyimides. A variety of polymers including polyparaphenylevinylenes, polyanilines, polyazines, polythiophenes, poly-p-phenylene sulfides, polyfuranes, polypyrroles, polyselenophene, and polyacetylenes may be doped with the above noted precursors and then rendered conductive upon exposure to an energy source.

SUMMARY OF THE PREFERRED EMBODIMENTS

Embodiments of the present invention relate to a method of forming an electronic device comprising the steps of providing a gate oxide layer over a substrate and providing a conducting layer over the gate oxide layer. A resist layer is provided over the conducting layer, and a charge dissipation layer is provided over the resist layer. The charge dissipation layer includes a conducting polymer having the following structure:

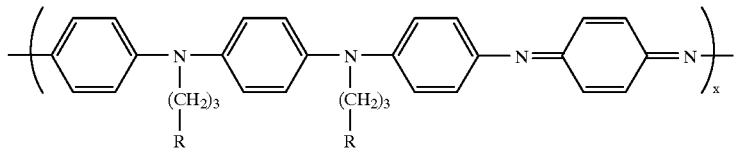

where R is an acid and X reflects the fact that the conducting polymer structure is repeated. The resist layer is exposed to an electron beam to form a pattern in the electron beam resist layer and the resist layer is developed after exposure to the electron beam.

Embodiments of the present invention also relate to a method for forming a mask comprising the steps of providing a layer of insulating material and a layer of metal over the insulating material. A layer of resist material is provided over the layer of metal, and a charge dissipation layer is provided over the layer of resist material. The charge dissipation layer including a conducing polymer having the following structure:

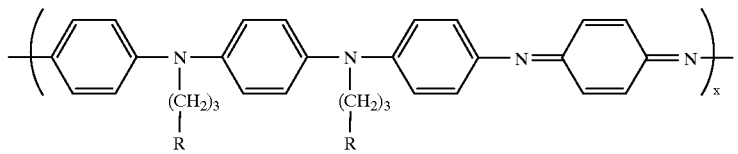

wherein R is an acid. Portions of the resist layer are exposed to an electron beam and the resist layer is developed.

Embodiments of the present invention also relate to a method for performing electron beam lithography comprising providing a substrate and providing a resist material over the substrate. A layer comprising a water soluble self-acid-doped conducting polyaniline is provided over the resist. Portions of the resist are exposed to an electron beam to form a pattern and the resist is developed after exposure to the electron beam.

BRIEF DESCRIPTION OF THE DRAWINGS

Embodiments of the present invention are described with reference to the accompanying drawings which, for illustrative purposes, are schematic and are not drawn to scale, where.

DETAILED DESCRIPTION OF THE PREFERRED EMBODIMENTS

Figure 1:
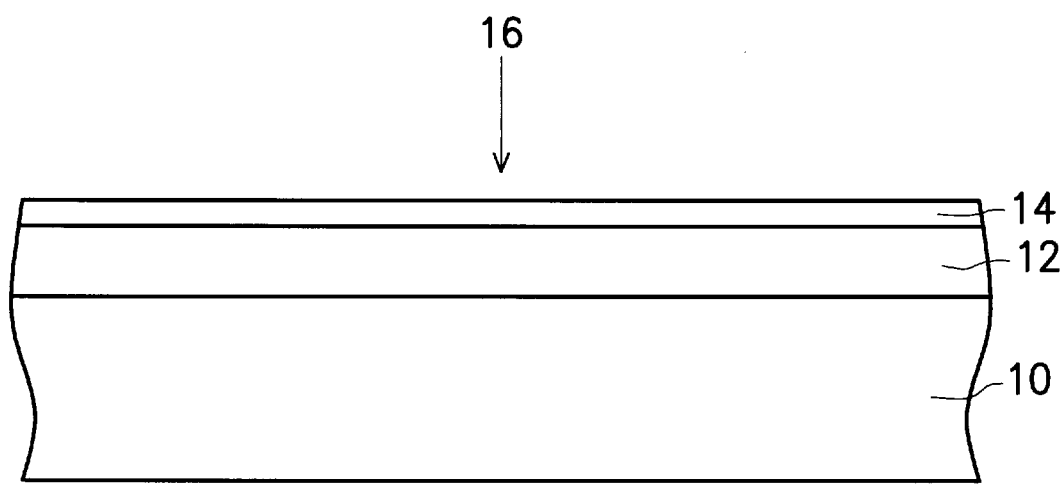
FIG. 1 illustrates the use of a charge dissipation coating over a resist layer during electron beam lithography according to embodiments of the present invention.
Figure 2:
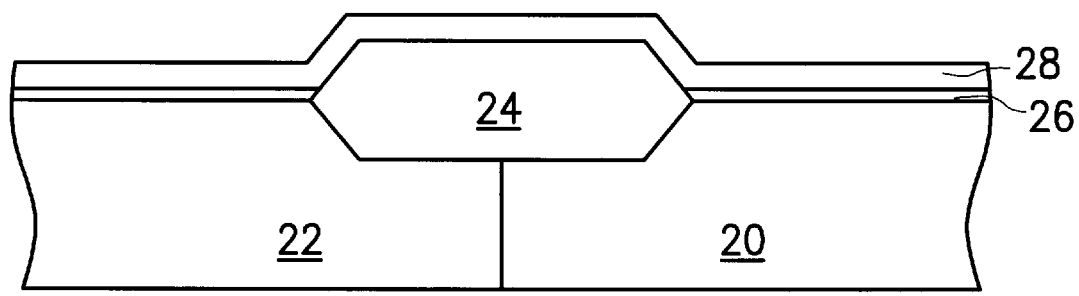
FIGS. 2–5 illustrate process steps in the formation of an electronic device using electron beam lithography according to embodiments of the present invention.

As electronic devices are scaled down to have structural dimensions in the submicron range, conventional optical and ultraviolet lithographic techniques are limited in resolution by the wavelength of the light used in the photolithography processes. Electron beam lithography is capable of higher resolution than optical or ultraviolet lithography due to the substantially smaller wavelengths available for electrons as compared to the shortest ultraviolet light available. As a result, finer device structures can be formed using electron beam lithography. Electron beam methods are limited, however, by several factors including static charge build up at the insulating surface of the electron beam resist which can distort the electron beam and can lead to pattern registration errors and poor overlay accuracy.

Embodiments of the present invention relate to the use of a charge dissipation layer for electron beam lithography. According to certain preferred embodiments, a layer of charge dissipation polymer is placed over a resist layer prior to exposure of the resist with the electron beam. The charge dissipation layer preferably includes a conducting poly (aniline-co-N-propanesulfonic acid aniline), hereinafter referred to as PAPSAH, having the following structure:

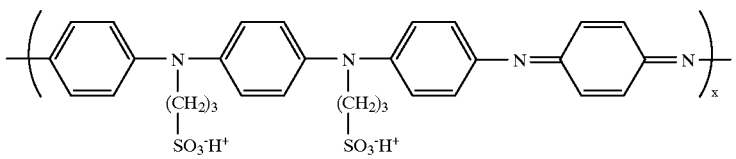

The charge dissipation layer may be a mixture including the PAPSAH and polyvinyl alcohol. The charge dissipation layer reduces the level of charge build up during electron beam patterning of the resist and thereby reduces the amount of beam distortion and deflection, resulting in greater practical resolution in the electron beam lithography process. Embodiments of the present invention may be used for a variety of electron beam applications including, for example, mask formation and direct writing of patterns for device fabrication.

Test samples having a charge dissipation layer including PAPSAH were formed as described below. The PAPSAH was formed using the emeraldine base form of polyaniline, which has the following structure:

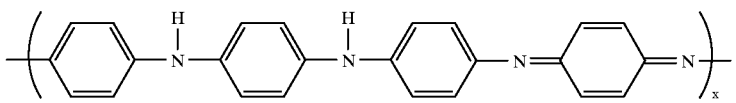

To form the PAPSAH, 2.26 grams of the dried emeraldine base form of polyaniline was reacted with excess NaH (0.9 grams) in dimethylsulfoxide (DMSO) at about 45° C. under a dried nitrogen atmosphere for 6 hours. The color of the solution changed from dark blue to green-black. The solution was subsequently reacted with excess 1,3-propanesultone (4.57 grams) for 20 hours at room temperature to give a blue-black solution. The solution was precipitated with a 1 M HCl aqueous solution, and the green precipitate after filtration was washed by a large amount of acetonitrile and then undoped with a NaOH aqueous solution to yield a blue solution. The solution was then purified by dialysis with a semipermeable membrane in DI water, which was replaced with fresh DI water repeatedly for 3 days. The aqueous solution obtained comprised poly (aniline-co-sodium N-propane sulfonate), the structure of which is shown below:

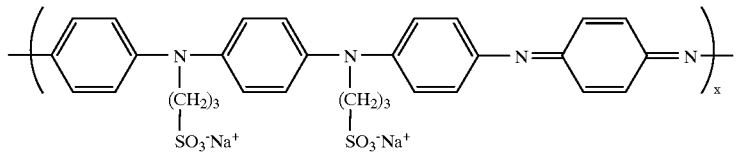

The poly(aniline-co-sodium N-propane sulfonate) aqueous solution was then converted to poly(aniline-co-N-propane sulfonic acid aniline) (or PAPSAH) by dissolving it in DI water and then exchanging $Na^+$ for $H^+$ using an $H^+$ type ion exchange resin to give an aqueous solution green in color. The resultant PAPSAH is useful as a charge dissipation layer in electron beam applications because of its moderate conductivity and water solubility. The as-formed conductivity of the PAPSAH reflects a different mechanism for charge dissipation than that described in the Angelopoulos patent discussed above. The resists of the Angelopoulos patent require excitation by an electron beam to become conductive. By not requiring an electron beam to excite conductivity, preferred embodiments of the invention more effectively reduce charge buildup over the entire surface of the charge dissipation layer, even over portions of the layer on which no electron beam is incident.

A test of the charge dissipation capability of a charge dissipation layer including PAPSAH prepared as described above was carried out as follows. The test structure is in most practical respects similar to a lithography mask and the following process can be used in forming familiar lithography masks with fine mask features. The PAPSAH was mixed with polyvinyl alcohol (PVA) at a ratio of 3:7, with a total solid content of about 1% by weight. A 5 inch×5 inch×0.09 inch quartz sample having a 100 nm thick layer of AR chromium and a 400 nm thick layer of electron beam resist (ZEP-520, from Nippon Zeoin) was coated with the mixture of PAPSAH in PVA. The electron beam used for exposure had an energy of 25 KeV and a dose of 50 $\mu C/Cm^2$. The layout for electron beam exposure was given as a 3×3 matrix with a total of 9 chips (5000 $\mu m \times 5000$ $\mu m$ each). Each chip was further partitioned into a 20×20 matrix totaling 400 dies (250 $\mu m \times 250$ $\mu m$). Each die included a 10 $\mu m \times 10$ $\mu m$ unexposed area with a square area of 2 $\mu m \times 2$ $\mu m$ located in the center which was exposed by the electron beam. If static charge builds up on the resist surface during the electron beam exposure, then the square area in the center drifts and is not fully centered after exposure.

After electron beam exposure for 20 hours, the treated quartz plate was immersed in DI water for 5 minutes and then in n-butyl acetate for 30 minutes to develop the resist into a patterned mask (much longer than the normal 1 minute developing time). After developing, optical microscopy was used to determine the location of the etched 2 $\mu m \times 2$ $\mu m$ hole for plates both having the charge dissipation coating and not having the charge dissipation coating. The results showed that the square area exposed by the electron beam showed a drift from the middle position of about 1 $\mu m$ when no charge dissipation coating was used. When the PAPSAH charge dissipation coating was used, there was no drift from the middle position. This reduction in drift indicates that the PAPSAH coating provides effective charge dissipation.

CMOS devices were fabricated using a mix and match lithography process in which optical lithography was used for all levels except for deep submicron polysilicon gate lines, which were formed using electron beam lithography. A charge dissipation coating including PAPSAH was used during the electron beam lithography to reduce charge build up and provide higher resolution in the lithography process. A twin-well process was used for fabricating the test devices. A flow chart of the twin-well CMOS process used is set forth as Table 1. Electron beam lithography steps were incorporated into the process flow at steps 12–13.

TABLE 1

| | | | |
|---|---|---|---|
| 1. | N-Well Implantation | 12. | Poly-Si Deposition |
| 2. | Well Oxide | 13. | Poly-RIE |
| 3. | P-Well Implantation | 14. | N-LDD Implantation |
| 4. | Well Drive-in | 15. | P-LDD Implantation |
| 5. | P-Field Implantation | 16. | Spacer Formation |
| 6. | Field Oxide | 17. | N + S/D Implantation |
| 7. | Sacrificial Oxide | 18. | P + S/D Implantation |
| 8. | Threshold Adjust Implantation ($V_t$) | 19. | TEOS |
| 9. | N-Anti Punch Through (APT) | 20. | Contact Etch |
| 10. | P-Anti Punch Through (APT) | 21. | Plug Implantation |
| 11. | Gate Oxide | 22. | Metal I |

The thickness of the gate oxide and gate polysilicon were 8.5 nm and 300 nm, respectively, and the spacers used in the LDD source/drain formation are formed to a width of about 120 nm. The thermal parameters for the CMOS twin-well process are shown in Table 2. Tables 3 and 4 show the implant parameters for the PMOS FET and NMOS FET devices, respectively. An N+ polysilicon gate was used for both the NMOS FET and PMOS FET.

TABLE 2

| | Temp. (° C.) | Time (min.) | Thickness (Å) |
|---|---|---|---|
| Well Drive In | 1100 | 135 | 1700 |
| Field Oxide | 980 | 145 | 5500 |
| Gate Oxide | 900 | 80 | 85 |
| Spacer (TEOS) | 700 | 25 | 2000 |
| Source/Drain Oxidation | 850 | 30 | 80 |
| TEOS | 700 | 60 | 5500 |
| Densify Oxide | 850 | 20 | 60 |
| Plug Annealing | 850 | 10 | — |

TABLE 3

PMOS FET

| Implant | Species | Energy | Dose | Angle |
|---|---|---|---|---|
| N-Well | P31 | 120 KeV | 1.8E13 | 0° |
| Vt | BF2 | 50 KeV | 2.0E12 | 0° |
| P-APT | P31 | 50–70 KeV | 2.0E12 | 0° |
| N+ Poly | P31 | 50 KeV | 1.0E16 | 0° |
| P-LDD | BF2 | 40 KeV | 3–5E13 | 15° |
| P+ S/D | BF2 | 50 KeV | 2.5E15 | 0° |
| Plug | P31 | 50 KeV | 2.0E15 | 0° |

TABLE 4

NMOS FET

| Implant | Species | Energy | Dose | Angle |
|---|---|---|---|---|
| P-Well | BF2 | 80 KeV | 9E12 | 0° |
| Vt | BF2 | 50 KeV | 2E12 | 0° |
| N-APT | B11 | 60 KeV | 4E12 | 0° |
| N+ Poly | P31 | 50 KeV | 1E16 | 0° |
| N-LDD | P31 | 50 KeV | 2.7E13 | 15° |
| N+ S/D | As | 60 KeV | 5E15 | 0° |
| Plug | P31 | 50 KeV | 2.0E15 | 0° |

Optical lithography steps for the CMOS process were carried out using an ASM PAS-2500 system in the conventional manner, up to the gate definition process. Alignment marks were placed on the polysilicon layer and near the device areas using the ASM PAS-2500 stepper to expose a photoresist mask followed by a first polysilicon etch step and photoresist ashing. These alignment marks were used to align the electron beam. The fine polysilicon features (i.e., the gate electrode) were exposed by electron beam lithography. The electron beam lithography was carried out using a Jeol JBX-5DII electron beam system. The blanket polysilicon layer was covered with a layer of electron beam resist (ZEP-520) approximately 400 nm thick. The ZEP-520 resist is desirable because it has a high sensitivity (30 $\mu C/cm^2$), high resolution (to 75 nm) and high process latitude. The resist layer was then covered with a charge dissipation layer comprising an aqueous solution of PAPSAH and polyvinyl alcohol at a weight ratio of 3:7, with a total solid content of about 1% by weight. The resist was exposed using the Jeol JBX-5DII at an energy of about 25 KeV and a dose of about 40 $\mu C/cm^2$. Following the electron beam exposure, the resist was developed using DI water followed by an n-butyl acetate rinse. A second polysilicon etching step was carried out to define the polysilicon gate electrodes using reactive ion etching with an etchant derived from HCl and HBr gases. Design rules for use in optical lithography were used for forming polysilicon lines ranging from 0.3 $\mu$m to 10 $\mu$m using the electron beam lithography and etching process. The length of the gate after electron beam lithography was determined after etching using scanning electron microscopy, with the resultant gate length set forth in Table 5. The results indicate that for the smaller size lines, the electron beam yielded lines that were about 0.15 to 0.2 $\mu$m smaller than those formed using optical lithography for the smallest design rules.

TABLE 5

| Optical Lithography Design Rule Line Length ($\mu$m) | Electron Beam Lithography Line Length ($\mu$m) |
|---|---|
| 2 | 2.110 ± 0.032 |
| 1 | 0.917 ± 0.031 |
| 0.9 | 0.809 ± 0.023 |
| 0.8 | 0.694 ± 0.017 |
| 0.7 | 0.568 ± 0.007 |
| 0.6 | 0.451 ± 0.003 |
| 0.5 | 0.327 ± 0.018 |
| 0.4 | 0.229 ± 0.003 |
| 0.3 | 0.104 ± 0.011 |

Deep submicron lines can be readily formed by performing electron beam lithography using a charge dissipation layer including PAPSAH such as the mixture described above.

Embodiments of the present invention may also include a charge dissipation layer having a more general polyaniline structure than that of PAPSAH, as shown below:

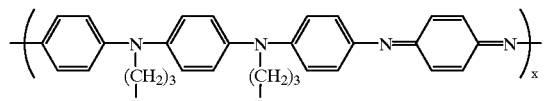

Component R may, for example, be a water soluble acid group other than sulfonic acid, such as nitric acid.

In another aspect of certain preferred embodiments of the present invention, the PAPSAH charge dissipation layer is placed over a positive resist layer. Although high sensitivity and contrast may be obtained using a negative resist, the sensitivity may be affected by the delay between post exposure baking and development. As a result, for nanometer sized device fabrication, it is hard to control the sensitivity of negative resists and a positive resist is preferred. It is believed that a high resolution positive resist can be used for obtaining resolution down to the nanometer scale, provided the surface charge effect is inhibited. Accordingly, certain preferred embodiments of the present invention include the use of a positive resist with the PAPSAH charge dissipation layer.

FIGS. 1–6 illustrate certain preferred embodiments of the present invention that may be used for a variety of electron beam applications, including direct writing and mask fabrication. Substrate 10 may be a substrate used for device fabrication or may be a mask material. Resist layer 12 is deposited over the substrate 10, and charge dissipation layer 14 is deposited over the resist layer. The electron beam 16 may travel in a direction perpendicular to the surface and first contact the charge dissipation layer 14. The charge dissipation layer 14 is preferably a material that includes PAPSAH. The PAPSAH may be mixed with a solvent such as polyvinyl alcohol as described above.

Figure 3:
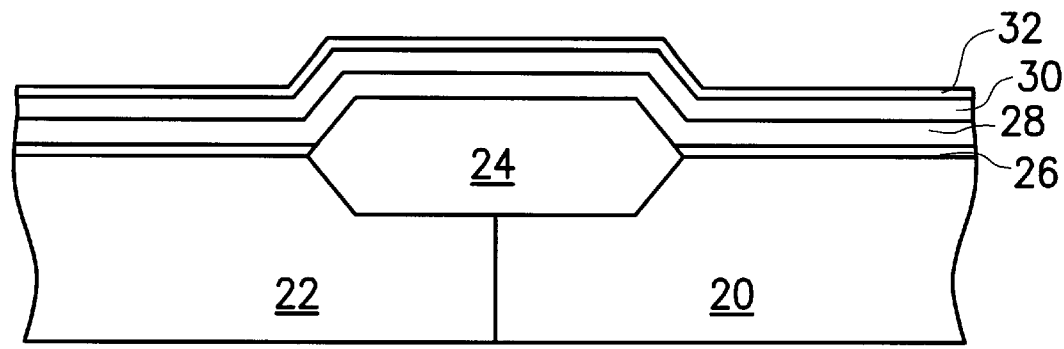
Figure 4:
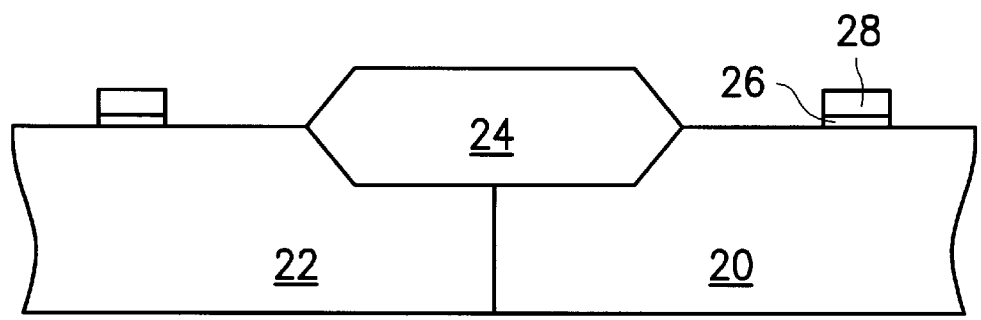
Figure 5:
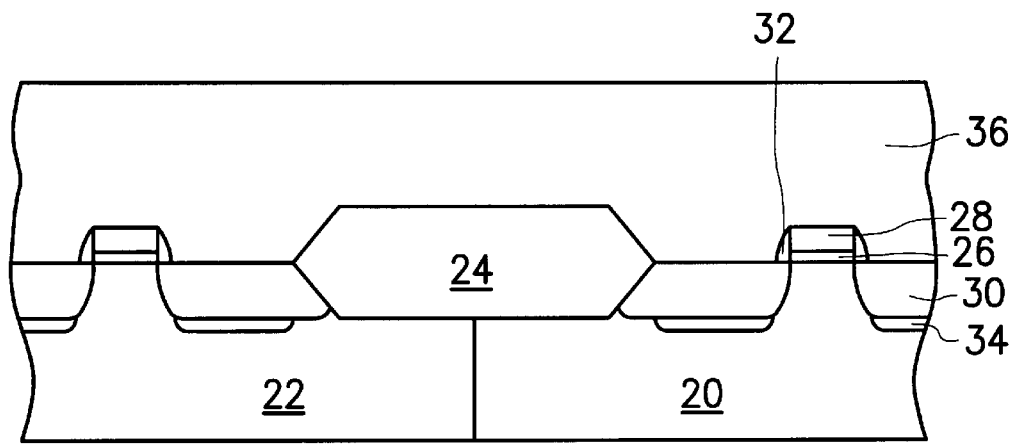

An example of an electronic device such as an input or output buffer manufactured using electron beam lithography according to certain embodiments of the present invention is illustrated in FIGS. 2–5. The buffer may include an inverter formed partially within n-well 20 and p-well 22 formed in a silicon substrate. Field oxide layer 24 is formed, for example, using a local oxidation of silicon (LOCOS) or shallow trench isolation method. Ion implantations for threshold voltage adjustment and anti-punchthrough protection are carried out, followed by the formation of gate oxide layers 26 over each of the wells 20, 22. A conducting layer 28 such as polysilicon is formed over the gate oxide layer 26 and patterned to define the appropriate gate electrodes for each well region. The patterning is carried out by depositing a layer of electron beam resist 30, such as ZEP-520, over the polysilicon layer 28 and depositing a layer of charge dissipation material 32, such as a mixture of PAPSAH and PVA, over the electron beam resist 30, as illustrated in FIG. 3. Direct writing of the electron beam resist 30 with the electron beam is carried out to expose portions of the resist. The resist is then developed using, for example, distilled water followed by an n-butyl acetate rinse. A polysilicon etch step is then carried out to define the polysilicon gate electrodes using reactive ion etching, for example, with an etchant derived from HCl and HBr gases. In this manner, fine polysilicon gates including polysilicon 28 and gate oxide 26, as illustrated in FIG. 4, may be formed. Appropriate masking and implantation steps are carried out to form lightly doped drain region 30, followed by spacer 32 formation and additional implantations to form N+/P+ regions 34 as desired for the source/drain regions for each of the well regions. A dielectric layer 36 may be deposited over the structures, as illustrated in FIG. 5, and appropriate contacts to the gate electrode and source/drain regions may then be made.

Figure 6:
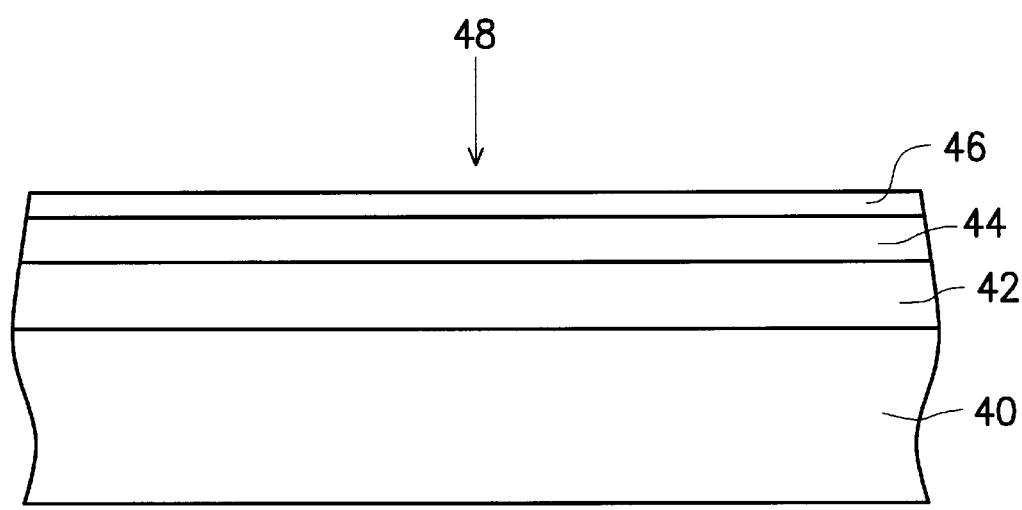
FIG. 6 illustrates a step in the process of forming a mask using electron beam lithography according to embodiments of the present invention.

An example of a process for forming a mask using electron beam lithography according to certain embodiments of the present invention is illustrated in FIG. 6. A metal layer 42 such as chromium is formed over a quartz substrate 40. An electron beam resist layer 44 such as ZEP-520 is formed over the chromium layer 42, and a charge dissipation layer 46 including PAPSAH and PVA is deposited over the resist layer 44. Selected portions of the resist layer 44 are exposed to the electron beam 48 and then the resist is developed. A reactive ion etch using a source gas derived from HCl may then be used to etch the uncovered portions of the chromium layer 42 to form openings in the mask, with the quartz layer 40 acting as an etch stop. The resulting mask can then be used in optical lithography processes.

While the present invention has been described with particular emphasis on certain preferred embodiments of the present invention, the present invention is not limited to the particular embodiments described herein. For example, other processing methods may be used for forming PAP-SAH. In addition, a variety of device components other than wiring lines and masks may be processed using electron beam lithography. The scope of the present invention is to be determined by the following claims.

What is claimed:

1. A method of forming an electronic device comprising the steps of:

providing a gate oxide layer over a substrate;
   providing a conducting layer over the gate oxide layer;
   providing a resist layer over the conducting layer;
   providing a charge dissipation layer over the resist layer, the charge dissipation layer including a conducting polymer having the following structure:

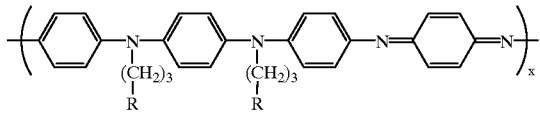

wherein R is an acid and X designates that the conducting polymer structure is repeated;

exposing the resist layer to an electron beam to form a pattern in the resist layer; and
   developing the resist layer after exposure to the electron beam.

2. The method of claim 1, wherein portions of the conducting layer and gate oxide layer not covered by the electron beam resist are etched to form wiring lines in the device.

3. The method of claim 2, wherein one or more ion implantation steps are performed to implant ions into the substrate.

4. The method of claim 1, wherein the resist material is a positive resist material.

5. The method of claim 1, wherein the charge dissipation layer includes polyvinyl alcohol.

6. The method of claim 5, wherein the weight ratio of the conducting polymer to polyvinyl alcohol is about 3 to 7.

7. The method of claim 5, wherein the charge dissipation layer is formed as an aqueous solution of the conducting polymer and polyvinyl alcohol.

8. The method of claim 7, wherein the aqueous solution includes about 1% by weight solid material.

9. The method of claim 1, wherein R is $HSO_3$.

10. The method of claim 1, wherein R is $HNO_3$.

11. A method for performing electron beam lithography comprising:

providing a substrate;
   providing a resist material over the substrate;
   providing a layer comprising a water soluble self-acid-doped conducting polyaniline over the resist material;
   exposing portions of the resist to an electron beam to form a pattern; and
   developing the resist after exposure to the electron beam.

12. The method of claim 11, wherein the conducting polyaniline comprises poly(aniline-co-N-propanesulfonic acid aniline).

13. The method of claim 11, wherein the conducting polyaniline has the following structure:

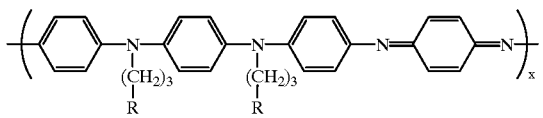

wherein R is an acid, and X designates that the conducting polyaniline structure is repeated.

14. The method of claim 13, wherein R is an acid comprising $HNO_3$.

* * * * *